(12) United States Patent
Shimizu et al.

(10) Patent No.: US 6,242,278 B1
(45) Date of Patent: Jun. 5, 2001

(54) METHOD FOR FORMING POLYCRYSTAL SILICON FILM FOR SEMICONDUCTOR ELEMENTS

(75) Inventors: Akira Shimizu; Satoshi Takahashi; Atsuki Fukazawa, all of Nagayama Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 09/337,920

(22) Filed: Jun. 22, 1999

(30) Foreign Application Priority Data

Jun. 22, 1998 (JP) .................................................. 10-175182

(51) Int. Cl.$^7$ .................................................. H01L 21/00
(52) U.S. Cl. .................................................. 438/96; 438/96
(58) Field of Search .............................. 438/96, 158, 162, 438/253, 255, 381, 396, 166, 486, 798

(56) References Cited

U.S. PATENT DOCUMENTS

| | | | |
|---|---|---|---|
| 5,116,784 | * | 5/1992 | Uashikawa ............................ 437/225 |
| 5,385,863 | | 1/1995 | Tatsumi et al. . |
| 5,623,243 | | 4/1997 | Watanabe et al. . |
| 5,639,689 | * | 6/1997 | Woo ........................................ 437/193 |
| 5,821,152 | * | 10/1998 | Han et al. ............................... 438/398 |
| 5,834,345 | * | 11/1998 | Shimizu ................................. 438/158 |
| 5,989,969 | * | 11/1999 | Watanabe et al. ..................... 438/381 |

* cited by examiner

Primary Examiner—David Nelms
Assistant Examiner—David Nhu
(74) Attorney, Agent, or Firm—Knobbe, Marten, Olson & Bear, LLP

(57) ABSTRACT

A rough surface made of polysilicon grains is formed on an amorphous silicon film disposed on a semiconductor substrate by the steps of: (i) forming an amorphous silicon-polysilicon mixed-phase layer having a first density on an activated surface of the amorphous silicon film by contacting the surface with a gas containing monosilane at a first flow rate of monosilane and at a first temperature; and (ii) annealing the amorphous silicon-polysilicon mixed-phase layer to form polysilicon grains therefrom, thereby forming a rough surface made of polysilicon grains. In the above, the improvement includes using disilane in place of monosilane at a second flow rate lower than the first flow rate and at a second temperature lower than the first temperature to form an amorphous silicon-polysilicon mixed-phase layer having a second density higher than the first density. Another improvement includes saturating the reactor with hydrogen gas during the heating step.

8 Claims, 5 Drawing Sheets

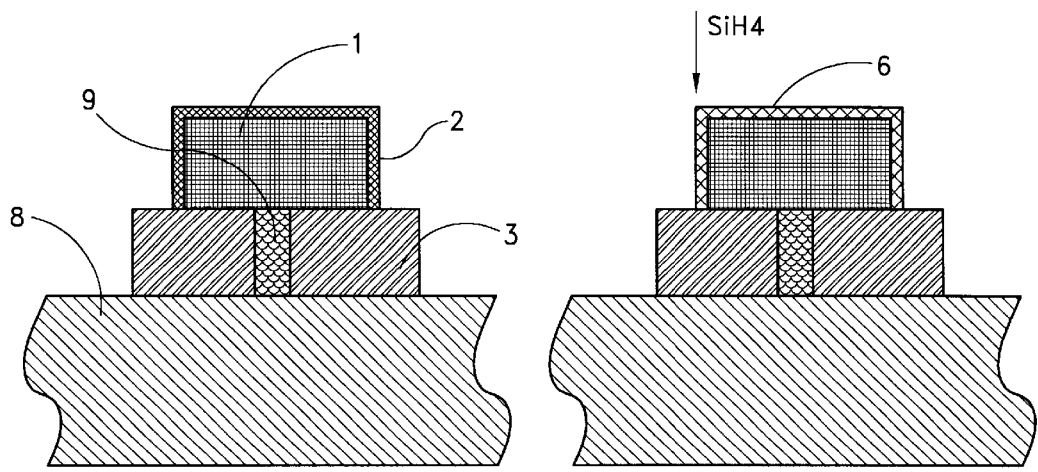
*Fig. 4a*
*Fig. 4d*
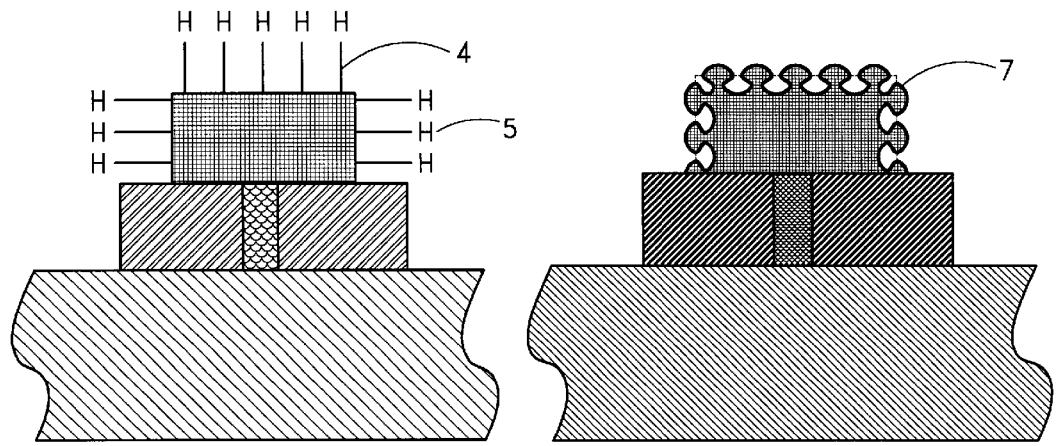
*Fig. 4b*
*Fig. 4e*
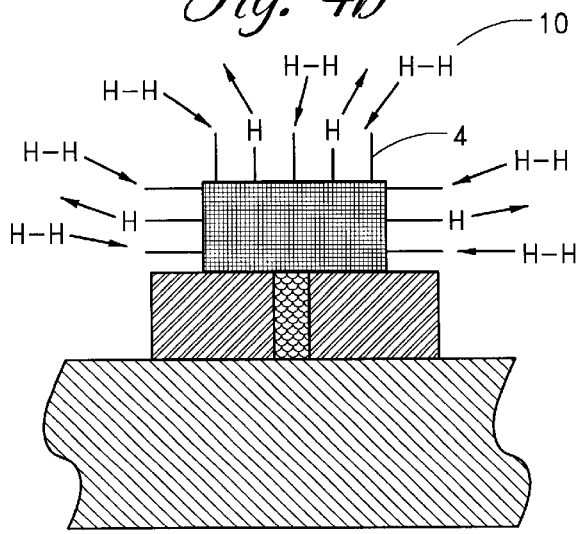
*Fig. 4c*

METHOD FOR FORMING POLYCRYSTAL SILICON FILM FOR SEMICONDUCTOR ELEMENTS

BACKGROUND OF THE INVENTION

1. Field of the Invention

The present invention relates to a method for manufacturing semiconductor elements and particularly for forming a polycrystal silicon film on the capacitor electrode surface.

2. Description of the Related Art

Due to the needs for more highly integrated semiconductor devices, further reduction in the cell size is being sought. Particularly in the field of Dynamic Random Access Memory (DRAM) for which one bit is composed of one transistor and one capacitor, if the cell size is reduced, the electrode area of the capacitor is decreased, hence the capacity value is decreased. As a result, problems such as lowered data hold time and incapability in preventing memory loss caused by an alpha ray will occur.

One method to solve this problem is to use a capacitor with a three-dimensional cylinder structure or a fin structure. However, this method has technical limitations.

As other methods, there is a method to increase the capacity value by using tantal oxide ($Ta_2O_5$) with a high induction rate or barium strontium titanate ($Ba_{(x)}Sr_{(1-x)}TiO_3$) with a strong induction film. However, this method has not been made fit for practical use.

As another notable method, there is a method called the HSG process that increases the capacity value by making the capacitor surface uneven in order to increase the surface area.

FIG. 1 roughly shows how work progresses in the HSG process. As shown in FIG. 1 (a), the amorphous silicon film (1) that is the capacitor understructure electrode is formed on the intercalation layer (3) formed on the silicon substrate (8). The semiconductor substrate (8) and the amorphous silicon film (1) are linked by polycrystal silicon (9). Also, naturally formed oxide film (2) adheres to the amorphous silicon film (1). After the naturally formed oxide film (2) is washed off during pre-processing, the clean surface of the amorphous silicon film (1) is exposed. At this point, hydrogen atoms (5) are bonded to the dangling bonds on the surface of the amorphous silicon film (1) (FIG. 1 (b)). This hydrogen (5) is desorbed by being heated at a processing temperature of approximately 560° C. and the surface of the amorphous silicon film (1) becomes activated (FIG. 1 (c)). In an atmosphere of monosilane (SiH4) gas, the mixed-phase active layer of amorphous-polycrystal silicon (6) is then selectively formed on the activated surface area by surface reaction (FIG. 1 (d)). At this point, if it is annealed at a temperature of approximately 560° C. for a predetermined time period, the amorphous in the mixed-phase active layer migrate with polycrystal silicon on the surface as a nucleus, crystallizes into polycrystal silicon and the polycrystal silicon grain (7) grows. As a result, highly crystalline silicon grains (HSG) (7) are formed on the amorphous silicon electrode (FIG. 1 (e)).

SUMMARY OF THE INVENTION

The present invention has exploited formation of a rough polysilicon film based on selective migration of amorphous silicon out of an amorphous silicon-polysilicon mixed-phase layer. The present inventors have identified problems and resolve the same as follows:

If the HSG method is used to form an amorphous silicon electrode having a rough surface, the following problems occur.

The surface of the amorphous silicon electrode is not completely non-crystalline but partially crystallized in many cases. This problem involves the conditions to form an underlying layer of the intercalation layer, the concentration of dopant phosphorus, the thermal hysteresis prior to HSG formation (e.g., the temperature of the heat-up step), and so forth. Among others, the effect of thermal hysteresis prior to HSG formation is very high.

FIG. 2 is a schematic view showing HSG processes when partial crystallization occurs in the amorphous silicon film. As shown in FIG. 2(c), an area near the surface of the amorphous silicon where dangling bonds are present is subject to crystallization. As a result, as shown in FIG. 2(d), ultimately, migration does not occur in the area of the amorphous silicon, i.e., the area remains flat without forming a rough surface. This event is called "bold defect (21)". Because of this bold defect (21), the surface of the amorphous silicon electrode is not rough, decreasing the advantageous effects extending the surface area.

In order to prevent such partial crystallization, the phosphorus dopant concentration may be lowered. However, when the phosphorus concentration on the surface decreases and if capacity value is measured by changing voltage, a decrease in the capacitance occurs on the negative voltage side. On the other hand, if the process temperature is decreased to lower thermal hysteresis, reaction speed is decreased, resulting in not only failure to reduce the thermal hysteresis but also decreasing the throughput. Further, employing a device for processing plural pieces may reduce thermal hysteresis. However, reproducibility is not satisfactory due to unstable temperature control under reduced pressure. In addition, during the heating step, hydrogen atoms may be desorbed, and migration is likely to occur where the activated surface is exposed, resulting in partial crystallization.

Consequently, an object of an embodiment of the present invention is to provide with a method to form an amorphous silicon electrode film having a rough surface, without bold defects, made of a polysilicon film (polysilicon grains) by migration of amorphous silicon from an amorphous silicon-polysilicon mixed-phase layer.

Another object of an embodiment of the present invention is to form an amorphous silicon electrode film with a rough surface generated by migration, which can be mass-produced and which excels in stability and reproducibility.

The present invention includes an aspect to provide a method for forming a rough surface made of polysilicon grains on an amorphous silicon film disposed on a semiconductor substrate, comprising the steps of: (i) forming an amorphous silicon-polysilicon mixed-phase layer having a first density on an activated surface of the amorphous silicon film by contacting the surface with a gas containing monosilane at a first flow rate of monosilane and at a first temperature; and (ii) annealing the amorphous silicon-polysilicon mixed-phase layer to form polysilicon grains therefrom, thereby forming a rough surface made of polysilicon grains, wherein the improvement comprises using disilane in place of monosilane at a second flow rate lower than the first flow rate and at a second temperature lower than the first temperature to form an amorphous silicon-polysilicon mixed-phase layer having a second density higher than the first density. According to this aspect, bold defects can be eliminated during formation of the amorphous silicon-polysilicon mixed-phase layer.

In the above, in preferable embodiments, the second flow rate may be 0.01 sccm to 2 sccm, and the second temperature may be approximately 20° C. lower than the first temperature. Further, the improvement can further comprise activating the surface of the amorphous silicon film at a temperature lower than the temperature when using monosilane.

Another aspect of the present invention is to provide a method for forming a rough surface made of a polycrystal silicon film on an amorphous silicon film disposed on a semiconductor substrate, comprising the steps of: (a) activating dangling bonds present on a surface of an amorphous silicon film in a reactor while introducing thereinto hydrogen gas; (b) forming an amorphous silicon-polysilicon mixed-phase layer on the surface of the amorphous silicon film by contacting the dangling bonds with a gas containing silane gas; and (c) annealing the amorphous silicon-polysilicon mixed-phase layer to form a rough surface made of doped polysilicon film. According to this aspect, bold defects can be eliminated during activation of dangling bonds.

In the above, in preferable embodiments, the silane can be monosilane or disilane, the flow rate of hydrogen gas can be such that the reactor is saturated with hydrogen gas, and the activation step can be conducted at a temperature of 450° C. to 590° C.

BRIEF DESCRIPTION OF THE DRAWINGS

FIGS. 4a–4e are a schematic views showing a third embodiment of the method for manufacturing semiconductor elements according to the present invention.

DETAILED DESCRIPTION OF THE PREFERRED EMBODIMENT

Figure 1A:
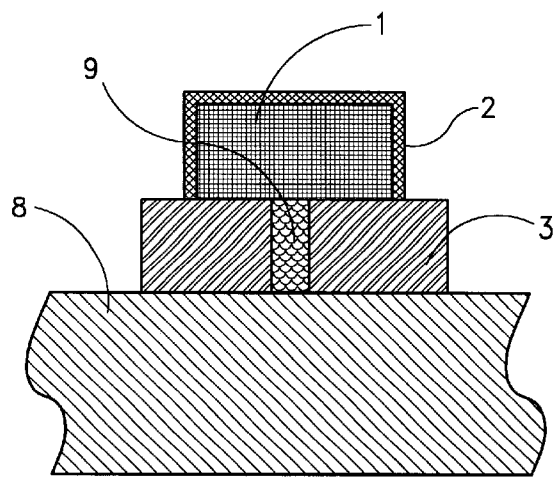
FIGS. 1a–1e are a schematic views showing a conventional HSG (highly crystalline silicon grains) process.
Figure 1B:
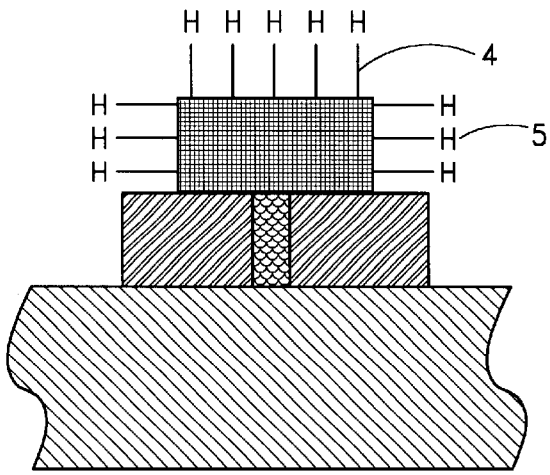
Figure 1C:
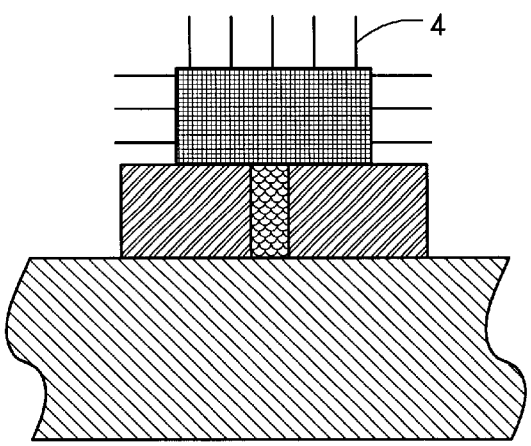
Figure 1D:
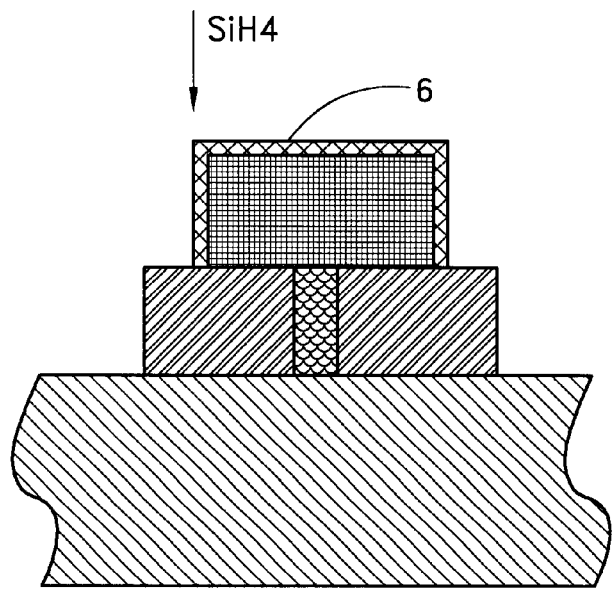
Figure 1E:
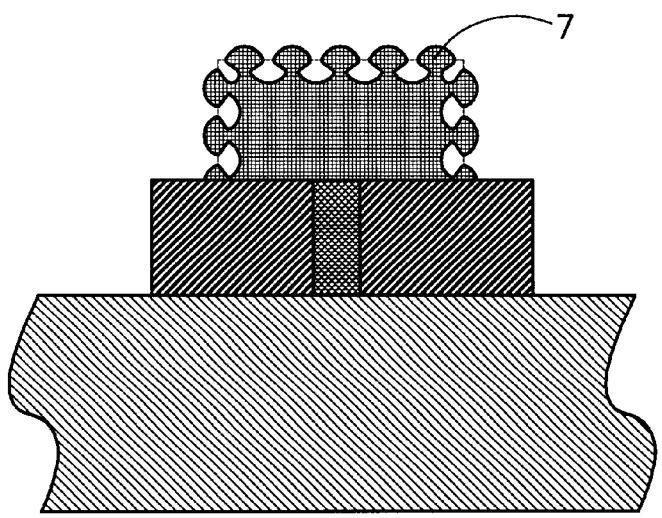
Figure 2A:
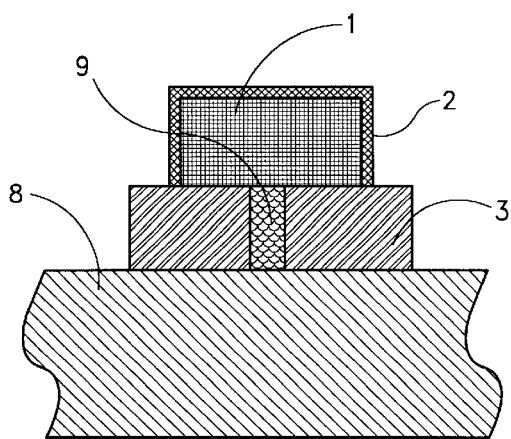
FIGS. 2a–2e are a schematic views showing a problematic HSG process causing partial crystallization resulting in bold defects.
Figure 2D:
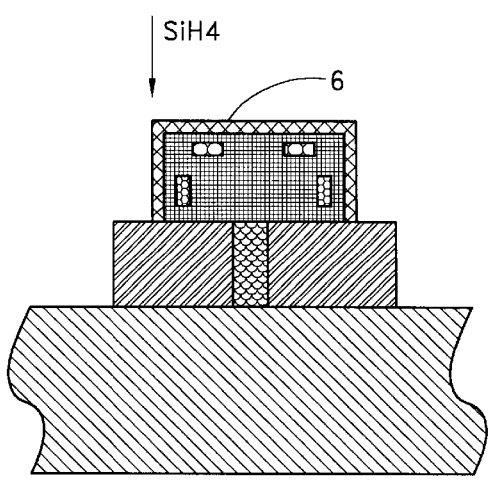
Figure 2B:
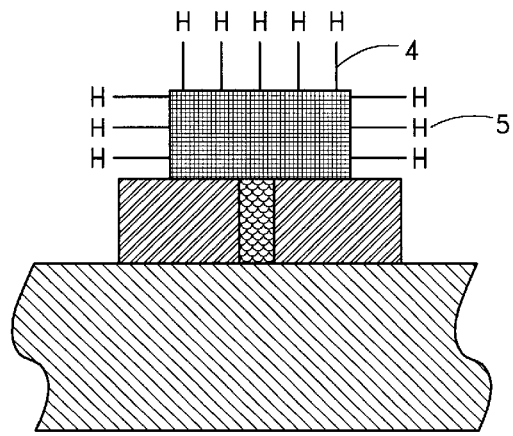
Figure 2E:
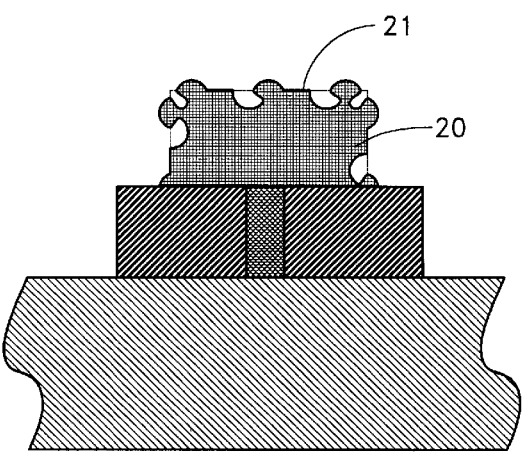
Figure 2C:
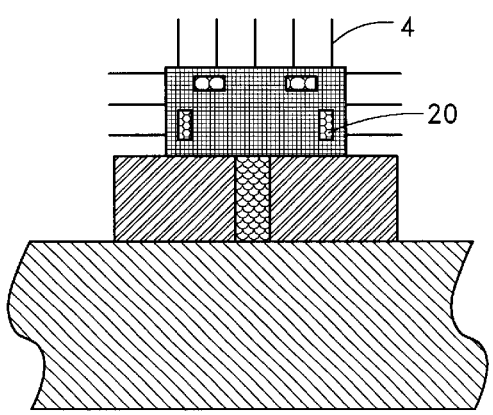

Basic Processes with Disilane for Forming Polysilicon Grains

To improve the conventional processes, according to an embodiment of the method of the present invention, the following processes may be conducted:

A method, which selectively forms a polycrystal silicon film in an uneven shape (rough surface) caused by migration on the amorphous silicon film accumulated on semiconductor substrate, comprises: (a) a process of substantially cleaning the surface of the amorphous silicon film, (b) a process of heating the amorphous silicon film to a predetermined temperature, (c) a process of selectively growing a thin amorphous silicon-polysilicon mixed-phase active layer film on the amorphous silicon film by surface reaction in a disilane atmosphere of predetermined concentration, and (d) a process of crystallizing the amorphous silicon surface by annealing it at a predetermined temperature for a predetermined time period and selectively forming a polycrystal silicon film in an uneven shape created by migration on the amorphous silicon surface, and (e) wherein it has characteristics that the density of a grain in the uneven shape is controlled by controlling the film thickness of the amorphous silicon-polysilicon mixed-phase active layer thin film, and (f) the size of the grain is controlled by controlling the annealing temperature and time period.

In an embodiment, preferably, in an embodiment, the temperature for heating is from 450° C. to 590° C.

Also preferably, in another embodiment, the flow rate of disilane is 0.01 sccm to 2 sccm.

Further, preferably, in another embodiment, the temperature for the annealing is from 450° C. to 590° C. and the time period may be from 1 minute to 80 minutes.

Basic Processes with Hydrogen Flow for Forming Polysilicon Grains

As a variation, a method for selectively forming a polycrystal silicon film in an uneven shape (rough surface) caused by migration on the amorphous silicon film accumulated on semiconductor substrate comprises: (a) a process of substantially cleaning the surface of the amorphous silicon film, (b) a process of heating the amorphous silicon film to a predetermined temperature in a hydrogen gas atmosphere, (c) a process of selectively growing an amorphous silicon-polysilicon mixed-phase active layer thin film on the amorphous silicon film by surface reaction in a monosilane (or disilane) atmosphere of predetermined concentration, and (d) a process of crystallizing the amorphous silicon surface by annealing it at a predetermined temperature for a predetermined time period and selectively forming a polycrystal silicon film in an uneven shape caused by migration on the amorphous silicon surface, (e) wherein the density of a grain in the uneven shape can be controlled by controlling the film thickness of the amorphous silicon-polysilicon mixed-phase active layer thin film, and (f) wherein the size of the grain can be controlled by controlling the annealing temperature and time period. Furthermore, the method includes (i) a process of heating the surface of the uneven-shaped polycrystal silicon film to a predetermined temperature and (ii) a process of selectively growing phosphorus-doped polycrystal silicon on the surface of the uneven-shaped polycrystal silicon film by surface reaction in a $SiH_4$ and $PH_3$ atmosphere of predetermined concentration, and (iii) wherein the method has a characteristic that the amount of phosphorus to be doped on the surface of the uneven-shaped polycrystal silicon film is controlled by adjusting the flow of the $PH_3$.

Here preferably, in an embodiment, the temperature for heating of the surface of the amorphous silicon film and uneven-shaped polycrystal silicon film is from 450° C. to 590° C.

Also preferably, in other embodiments, the flow rate of hydrogen gas is 50 sccm to 200 sccm, and the flow rate of the concentration of silane is 5 sccm to 100 sccm when using monosilane or is 0.01 sccm to 2 sccm when using disilane.

Further, preferably, in another embodiment, the annealing is conducted at temperature of 450° C. to 590° C. for 1 minute to 80 minutes.

Basic Effects

Using the methods for manufacturing semiconductor elements in embodiments using disilane according to the present invention, an amorphous silicon electrode film with a rough surface without flat areas due to bold defects can be successfully formed without lengthening the processing time at a temperature lower than the temperature adapted in conventional HSG processes with $SiH_4$ gas. The process temperature can be approximately 20° C. lower than the temperature used in conventional processes. According to the above embodiments, thermal hysteresis is reduced, thereby preventing the occurrence of partial crystallization in the amorphous silicon. In the above, the surface area of the electrode can increase effectively.

In addition, using the methods for manufacturing semiconductor elements in other embodiments, the amorphous silicon electrode film having a rough surface can be successfully formed by reducing the influence of thermal hysteresis during the heating step, thereby preventing partial crystallization. As a result, the rough surface does not include flat areas due to bold defects. In the above, the surface area of the electrode can increase effectively.

Furthermore, using the methods for manufacturing semiconductor elements, the amorphous silicon electrode film with a rough surface can be formed using a hot-wall type apparatus in a batch type, and thus can be mass-produced and which excels in stability and reproducibility.

First Embodiment

Figure 3A:
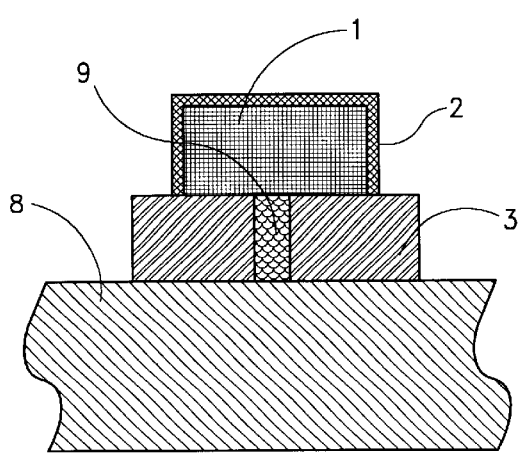
FIGS. 3a–3e are a schematic views showing first and second embodiments of the method for manufacturing semiconductor elements according to the present invention.
Figure 3D:
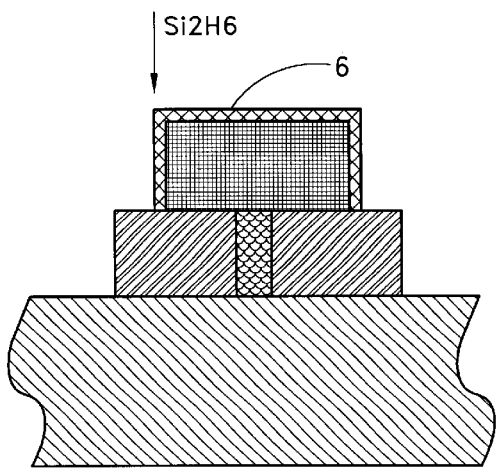
Figure 3B:
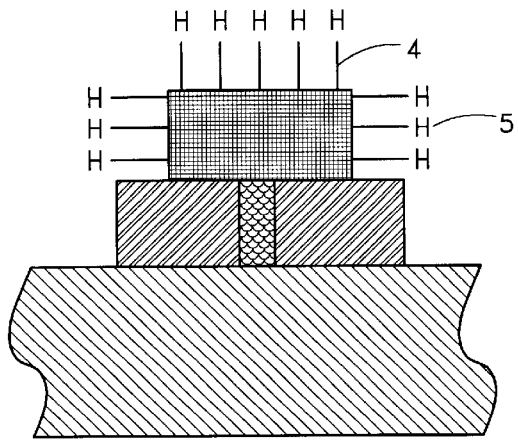
Figure 3E:
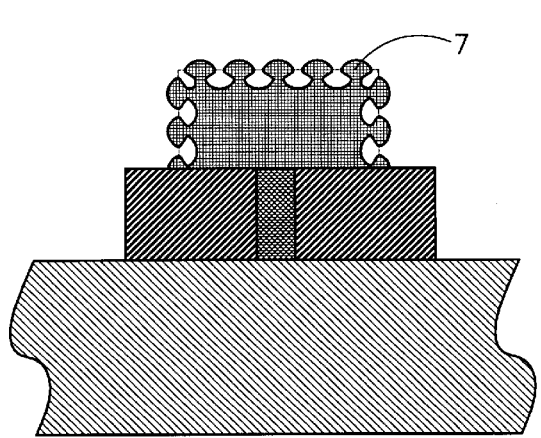
Figure 3C:
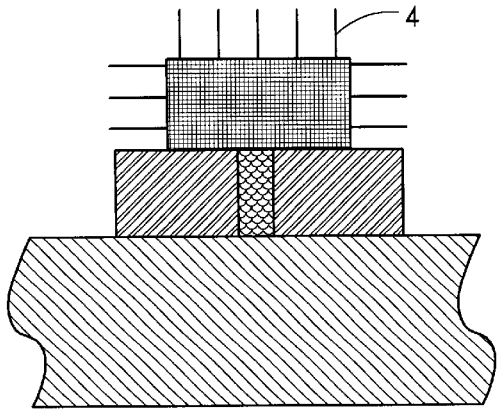

FIG. 3 schematically illustrates the process drawing of the first implementation example of the method for manufacturing semiconductor elements based on the present invention. In addition, basically a batch style device of the hot-wall type is used for the method based on the present invention.

This method that selectively forms a polycrystal silicon film with an uneven shape caused by migration on the amorphous silicon film accumulated on semiconductor substrate comprises a process of substantially cleaning the surface of the amorphous silicon film, a process of heating the amorphous silicon film to a predetermined temperature, a process of selectively growing amorphous silicon-polysilicon mixed-phase layer thin film on the amorphous silicon film by surface reaction in a $Si_2H_6$ atmosphere instead of a $SiH_4$ atmosphere and a process of crystallizing the amorphous silicon surface by annealing it at a predetermined temperature for a predetermined time period and selectively forming a polycrystal silicon film in an uneven shape caused by migration on the amorphous silicon surface.

As shown FIG. 3 (a), the capacitor electrode comprises the intercalation layer (3) formed evenly on the silicon substrate (8), the amorphous silicon film (1) formed on the intercalation layer (3), and polycrystal silicon (9) linking the amorphous silicon film (1) and the silicon substrate (8). Naturally formed oxide film (2) adheres to the amorphous silicon film (1).

In the first implementation example of the present invention, the naturally formed oxide film is removed and the surface of the amorphous silicon film is cleaned. This is so-called pre-processing. To remove naturally formed oxide film, diluted HF of about 0.3% is used. The semiconductor substrate is then rinsed in de-ionized water and dried.

The next process is the heating process. As shown in FIG. 3 (b), after pre-processing is completed, the amorphous silicon surface is cleaned and hydrogen atoms (5) are bonded to dangling bonds (4). After drying is completed, the semiconductor substrate is injected into the evacuated cassette module by a dry pump. Then the inside of the cassette module is maintained at 1Torr by introducing nitrogen ($N_2$) to the reactor. The semiconductor substrates are then conveyed one by one to the boat elevator chamber that is evacuated through the wafer transfer module that is also maintained at 1 Torr. After all semiconductor substrates have been conveyed, the wafer transfer module and the boat elevator chamber are separated by the gate valve. The boat elevator chamber then loads a boat on which the semiconductor substrates have been placed into the inside of the surface-reaction thin film formation reactor that is evacuated to a base pressure (1E–7Torr~1E–10Torr) using a turbo molecular pump. The semiconductor substrates loaded inside the reactor are heated until the temperature reaches 450° C.~590° C. (suitably 500° C.~560° C.) for approximately 20 minutes while introducing helium (He) gas of 50 scm~200 scm. Because of this heating, hydrogen on all dangling bonds is eliminated and the amorphous silicon surface becomes activated (FIG. 3(c)).

The next process is the growth process of the amorphous silicon-polysilicon mixed-phase active layer. As described above, in conventional HSG processes, $SiH_4$ is used as a reaction gas, and the heating step is conducted at a relatively high temperature such as 560° C. However, as described above, this treatment leads to partial crystallization of the amorphous silicon due to an increase in thermal hysteresis. On the other hand, in conventional processes using a batch style hot-wall type apparatus, $Si_2H_6$ cannot be used in practice because $Si_2H_6$ gas is highly reactive. The batch-style hot-wall type apparatus has a relatively long residence time of reaction gas, and thus reactive $Si_2H_6$ causes deposition of polysilicon not only on the amorphous silicon but also on the intercalation layer. Thus, it is difficult to form HSG while maintaining good selectivity (i.e., depositing polysilicon exclusively on the amorphous silicon, not on the intercalation layer).

In the first implementation example of the present invention, instead of $SiH_4$ gas, $Si_2H_6$ is used at a flow rate of 0.01 sccm to 2 sccm, thereby lowering the processing temperature, thereby reducing thermal hysteresis and preventing partial crystallization. That is, it has been found by the inventors that, in the processes using disilane gas, when reducing the flow rate, the thickness of the amorphous-polysilicon mixed-phase layer is decreased, but the density of the layer is increased. This may be because when the concentration of disilane is decreased, the growth speed decreases, but the proportion of polysilicon in the amorphous-polysilicon mixed-phase layer increases.

Further, by using a low flow rate (e.g., 0.01 sccm to 2 sccm) of disilane, it is possible to prevent growth of polysilicon on the intercalation layer and to form HSG selectively on the amorphous silicon. The processing time is not lengthened. The processing temperature can be approximately 20° C. lower than the temperature adapted when using monosilane gas.

In the first embodiment, disilane gas, which may be diluted with helium at 5%~60% (suitably at 30%~50%), is introduced at a flow rate of 1 sccm first in the surface-reaction thin film formation reactor evacuated at 1E–3Torr~1E–7Torr. In this embodiment, the amorphous-polysilicon mixed-phase layer is formed exclusively on the activated amorphous film (FIG. 3 (d)). At this point, the film thickness of the mixed-phase thin film of amorphous-polycrystal silicon can be controlled by changing the introducing time of $SiH_4$ gas, and the grain density can be controlled by adjusting this film thickness.

The last process is the annealing process. The gas flow is stopped after the active amorphous-polysilicon mixed-phase thin film has formed, and annealing processing is performed continuously for 1~80 minutes under conditions where the inside of the reactor is evacuated to the base pressure (1E–7Torr~1E–10Torr) using the turbo molecular pump. The reactor temperature at this time is maintained at 450° C.~590° C. (suitably 520° C.~580° C.). With polycrystal silicon on the surface within the amorphous-polysilicon mixed-phase as a nucleus, migration of amorphous silicon occurs, the mixed-phase silicon is gradually crystallized, and a grain (7) is formed centering on a nucleus. Thus, rough HSG is formed on the selective domain surface (FIG. 3 (e)). At this point the grain size can be controlled by controlling the temperature and time period of annealing.

After the process is completed, the boat carrying the semiconductor wafers is unloaded and is returned to the cassette module via the wafer transfer module controlled at 1Torr by $N_2$ gas.

The HSG formed in the first embodiment did not show bold defects due to partial crystallization. The surface area of the HSG was 2.5 times that of samples obtained by processes other than the HSG process, and 2.1 times that of samples conventionally obtained by the HSG process using SiH$_4$ gas.

Second Embodiment

The second implementation example is now explained. The difference between the first embodiment and the second embodiment is the temperatures for the heating step and annealing. The temperature for the heating step is reduced to 520° C. and the temperature for annealing is 550° C. The flow rate of disilane is 0.2 sccm and the processes are continuously conducted. In general, when the concentration of dopant in the amorphous increases, the temperature for crystallization decreases. Thus, lowering the processing temperature is advantageous in raising the concentration of dopant in the amorphous silicon electrode.

The HSG formed in the second embodiment did not show bold defects due to partial crystallization. The surface area of the HSG was 2.7 times that of samples obtained by processes other than the HSG process, and 2.45 times that of samples conventionally obtained by the HSG process using SiH$_4$ gas.

Third Embodiment

The third implementation example for manufacturing semiconductor elements according to the present invention will be explained. FIG. 4 schematically illustrates the process drawing of the third implementation example for manufacturing semiconductor elements according to the present invention.

The difference of this third embodiment from the first and second embodiments resides in the heating step (FIG. 4 (c)). As described above, according to the first and second embodiments, the processing temperature can be reduced effectively, thereby successfully reducing thermal hysteresis. However, during the heating step, when hydrogen atoms are desorbed from dangling bonds, the exposed activated bonds may react to any contaminants or residual gas, thereby causing migration leading to partial crystallization. If the above occurs, the use of disilane is not effective because reducing the temperature cannot sufficiently prevent false migration. In view of the time period of the heating step which occupies 30% of the entire process, the possibility of the occurrence of false migration during the heating step is very high. Thus, in the third embodiment, hydrogen gas is introduced into the reactor at a flow rate of 50 sccm to 200 sccm during the heating step. Accordingly, even if hydrogen atoms are desorbed from dangling bonds, other hydrogen atoms (terminate hydrogen 10) immediately take their place and prevent false migration (FIG. 4 (c)). The hydrogen gas used can be completely removed from the reactor in a short period of time (e.g., 1 minute to 5 minutes) by vacuuming, prior to activation and growth of an amorphous-polysilicon mixed active layer. The flow of hydrogen gas for the above purpose may be such that the reactor is saturated with hydrogen gas. In the above, the pressure in the reactor may be maintained at 1E–1Torr~1E–6Torr (preferably 1E–1Torr~1E–4Torr). Additionally, in the above, in another embodiment, instead of disilane, monosilan can be used at a flow rate 5 sccm to 100 sccm, and at a temperature of 520° C. to 580° C. during the heating step.

The HSG formed in the third embodiment did not show bold defects due to partial crystallization. The surface area of the HSG was 2.5 times that of samples obtained by processes other than the HSG process, and 2.1 times that of samples conventionally obtained by the HSG process using SiH$_4$ gas.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. In a method for forming a rough surface made of polysilicon grains on an amorphous silicon film disposed on a semiconductor substrate, comprising the steps of:

(i) forming an amorphous silicon-polysilicon mixed-phase layer having a first density on an activated surface of the amorphous silicon film by contacting the surface with a gas containing monosilane at a first flow rate of monosilane and at a first temperature; and (ii) annealing the amorphous silicon-polysilicon mixed-phase layer to form polysilicon grains therefrom, thereby forming a rough surface made of polysilicon grains;

wherein the improvement comprises, throughout the mixed-phase formation step, using disilane in place of monosilane at a second flow rate lower than the first flow rate and at a second temperature lower than the first temperature to form an amorphous silicon-polysilicon mixed-phase layer having a second density higher than the first density, said second flow rate being 0.01 sccm to 2 sccm, said second temperature being approximately 20° C. lower than the first temperature and being constant in the range of 450–560° C.

2. The improvement as claimed in claim 1, further comprising activating the surface of the amorphous silicon film at a temperature lower than the temperature when using monosilane.

3. A method for forming a rough surface made of a polycrystal silicon film on an amorphous silicon film disposed on a semiconductor substrate, comprising the steps of:

activating dangling bonds present on a surface on an amorphous silicon film in a reactor substantially saturated with hydrogen gas at a reduced pressure;

removing the hydrogen gas from the reactor;

forming an amorphous silicon-polysilicon mixed-phase layer on the surface of the amorphous silicon film by contacting the dangling bonds with a gas containing silane gas; and annealing the amorphous silicon-polysilicon mixed-phase layer to form a rough surface made of doped polysilicon film.

4. The method as claimed in claim 3, wherein the silane is monosilane or disilane.

5. The method as claimed in claim 3, wherein the flow rate of hydrogen gas is such that the reactor is saturated with hydrogen gas.

6. The method as claimed in claim 3, wherein the activation step is conducted at a temperature of 450° C. to 590° C.

7. The method as claimed in claim 3, wherein the silane is monosilane.

8. The method as claimed in claim 7, wherein the flow rate of hydrogen gas is 50–200 sccm wherein the pressure of the reactor is 1E–1 Torr to 1E–6 Torr; the activation step is conducted at a temperature of 520° C. to 580° C; and the flow rate of monosilane in the mixed-phase formation step is 5–100 sccm.

* * * * *